US012657355B2

(12) United States Patent
Jin et al.

(10) Patent No.: US 12,657,355 B2
(45) Date of Patent: Jun. 16, 2026

(54) METHOD, APPARATUS, DEVICE AND STORAGE MEDIUM FOR EVALUATING POWER SUPPLY DESIGN

(71) Applicant: Beijing Youzhuju Network Technology Co., Ltd., Beijing (CN)

(72) Inventors: Liangliang Jin, Beijing (CN); Jun Gu, Beijing (CN); Jifeng Li, Beijing (CN); Jian Wang, Beijing (CN)

(73) Assignee: Beijing Youzhuju Network Technology Co., Ltd., Beijing (CN)

( * ) Notice: Subject to any disclaimer, the term of this patent is extended or adjusted under 35 U.S.C. 154(b) by 0 days.

(21) Appl. No.: 19/093,184

(22) Filed: Mar. 27, 2025

(65) Prior Publication Data

US 2025/0225290 A1 Jul. 10, 2025

Related U.S. Application Data

(63) Continuation of application No. PCT/CN2023/114798, filed on Aug. 24, 2023.

(30) Foreign Application Priority Data

Sep. 28, 2022 (CN) .......................... 202211193069.1

(51) Int. Cl.
 *G06F 30/18* (2020.01)
 *G06F 30/398* (2020.01)
(52) U.S. Cl.
 CPC ............ *G06F 30/18* (2020.01); *G06F 30/398* (2020.01)
(58) Field of Classification Search
 CPC ........ G06F 30/18; G06F 30/398; G06F 30/12; G06F 2111/00; G06F 2119/22; G06F 30/23; G06F 30/39
 See application file for complete search history.

(56) References Cited

U.S. PATENT DOCUMENTS 5,598,348 A * 1/1997 Rusu ..................... G06F 30/398
                                                716/120
7,301,361 B2 11/2007 Kusano et al.
                (Continued)

FOREIGN PATENT DOCUMENTS

CN 1987872 A 6/2007
CN 104331546 A 2/2015
                (Continued)

OTHER PUBLICATIONS

J. Rius, "IR-Drop On-Chip Power Distribution Networks of ICs With Nonuniform Power Consumption" pp. 512-522, (Year: 2013).*
                (Continued)

*Primary Examiner* — Kibrom K Gebresilassie
(74) *Attorney, Agent, or Firm* — BakerHostetler

(57) ABSTRACT

According to embodiments of the disclosure, there are provided a method, an apparatus, a device, and a storage medium for evaluating a power supply design. The method includes determining a power supply network designed for a chip, the power supply network comprising a plurality of power supply lines for power transmission and indicating a position and a pattern of each of the plurality of power supply lines in the chip. The method includes generating, for the power supply network, an electrical configuration at least associated with a predetermined power consumption of the chip. The method includes determining predicted voltage losses at different positions of the power supply network with the electrical configuration. In this way, fast evaluation and verification of the power supply solution can be implemented, which is beneficial to shorten the cycle of the chip design.

20 Claims, 9 Drawing Sheets

300

(56) References Cited

U.S. PATENT DOCUMENTS

| | | | |
|---|---|---|---|
| 2009/0276742 A1 | 11/2009 | Wilson et al. | |
| 2012/0081157 A1* | 4/2012 | Greenhill | H03L 7/18 |
| | | | 327/155 |
| 2012/0110530 A1* | 5/2012 | Yang | G06F 30/398 |
| | | | 716/112 |
| 2016/0210392 A1* | 7/2016 | Wang | G06F 30/367 |
| 2018/0284919 A1* | 10/2018 | Kaddouri | G06F 3/044 |

FOREIGN PATENT DOCUMENTS

| | | |
|---|---|---|
| CN | 111965523 A | 11/2020 |
| CN | 112100959 A | 12/2020 |
| CN | 114722769 A | 7/2022 |

OTHER PUBLICATIONS

T. Sato, M. Hashimoto, H. Onodera, "Successive pad assignment algorithm to optimize number and location of power supply pad using incremental matrix inversion" pp. 723-728, IEEE (Year: 2005).*

International Search Report from PCT/CN2023/114798, dated Nov. 20, 2023, 5 pages with machine translation.

* cited by examiner

300

310

SET AN ELECTRICAL PARAMETER RELATED TO THE
PREDETERMINED POWER CONSUMPTION

320

OBTAIN A RESPECTIVE RESISTANCE VALUE OF EACH OF THE
PLURALITY OF POWER SUPPLY LINES

330

SPECIFY A CONNECTION POSITION BETWEEN AN EXTERNAL
POWER SUPPLY THAT SUPPLIES POWER TO THE CHIP AND THE
CHIP AND A VOLTAGE AT THE CONNECTION POSITION

340

SET AN OPERATING TEMPERATURE OF THE CHIP

500

510

DETERMINE A POWER SUPPLY NETWORK DESIGNED FOR A CHIP

520

GENERATE, FOR THE POWER SUPPLY NETWORK, AN ELECTRICAL
CONFIGURATION AT LEAST ASSOCIATED WITH A PREDETERMINED
POWER CONSUMPTION OF THE CHIP

530

DETERMINE PREDICTED VOLTAGE LOSSES AT DIFFERENT
POSITIONS OF THE POWER SUPPLY NETWORK WITH THE
ELECTRICAL CONFIGURATION

600

700

METHOD, APPARATUS, DEVICE AND STORAGE MEDIUM FOR EVALUATING POWER SUPPLY DESIGN

This application is a continuation of International Patent Application No. PCT/CN2023/114798, filed on Aug. 24, 2023, which claims the priority of Chinese Patent Application No. 202211193069.1, filed on Sep. 28, 2022, and entitled "METHOD, APPARATUS, DEVICE AND STORAGE MEDIUM FOR EVALUATING POWER SUPPLY DESIGN", which are incorporated herein by reference in their entireties.

FIELD

Example embodiments of the present disclosure generally relate to the field of semiconductors, and in particular to a method, apparatus, device and computer-readable storage medium for evaluating a power supply design.

BACKGROUND

Power supply integrity refers to the quality of a power supply waveform, and focuses on a power supply distribution network (PDN). The power supply integrity aims to comprehensively consider a system power supply network to eliminate or weaken the impact of noise on a power supply. The design goal of power supply integrity is to control power supply noise within a range of running and provide a clean and stable voltage for a chip. With the evolution of chip technology, the integration of devices is getting higher and higher, and the power supply distribution network is getting more and more complex. The integrity problem of a power supply solution may lead to performance degradation of the chip, and even failure of the chip in severe cases. Therefore, the power supply solution needs to be evaluated in terms of integrity.

SUMMARY

In a first aspect of the present disclosure, there is provided a method of evaluating a power supply design. The method comprises: determining a power supply network designed for a chip, the power supply network comprising a plurality of power supply lines for power transmission and indicating a position and a pattern of each of the plurality of power supply lines in the chip; generating, for the power supply network, an electrical configuration at least associated with a predetermined power consumption of the chip; and determining predicted voltage losses at different positions of the power supply network with the electrical configuration.

In a second aspect of the present disclosure, there is provided an apparatus for evaluating a power supply design. The apparatus comprises: a power supply network determination module configured to determine a power supply network designed for a chip, the power supply network comprising a plurality of power supply lines for power transmission and indicating a position and a pattern of each of the plurality of power supply lines in the chip; an electrical configuration generation module configured to generate, for the power supply network, an electrical configuration at least associated with a predetermined power consumption of the chip; and a voltage loss prediction module configured to determine predicted voltage losses at different positions of the power supply network with the electrical configuration.

In a third aspect of the present disclosure, there is provided an electronic device. The device comprises at least one processing unit; and at least one memory coupled to the at least one processing unit and storing instructions executable by the at least one processing unit. The instructions, when executed by the at least one processing unit, cause the device to perform the method of the first aspect.

In a fourth aspect of the present disclosure, there is provided a computer-readable storage medium. A computer program is stored on the computer-readable storage medium, and the computer program is executable by a processor to implement the method of the first aspect.

It should be understood that the content described in this content part is not intended to limit the key or important features of the embodiments of the present disclosure, nor is it intended to limit the scope of the present disclosure. Other features of the present disclosure will become readily understandable through the following description.

BRIEF DESCRIPTION OF THE DRAWINGS

The above and other features, advantages and aspects of embodiments of the present disclosure will become more apparent with reference to the following detailed description and in conjunction with the accompanying drawings. In the drawings, the same or similar reference numerals denote the same or similar elements, wherein.

DETAILED DESCRIPTION

Figure 1:
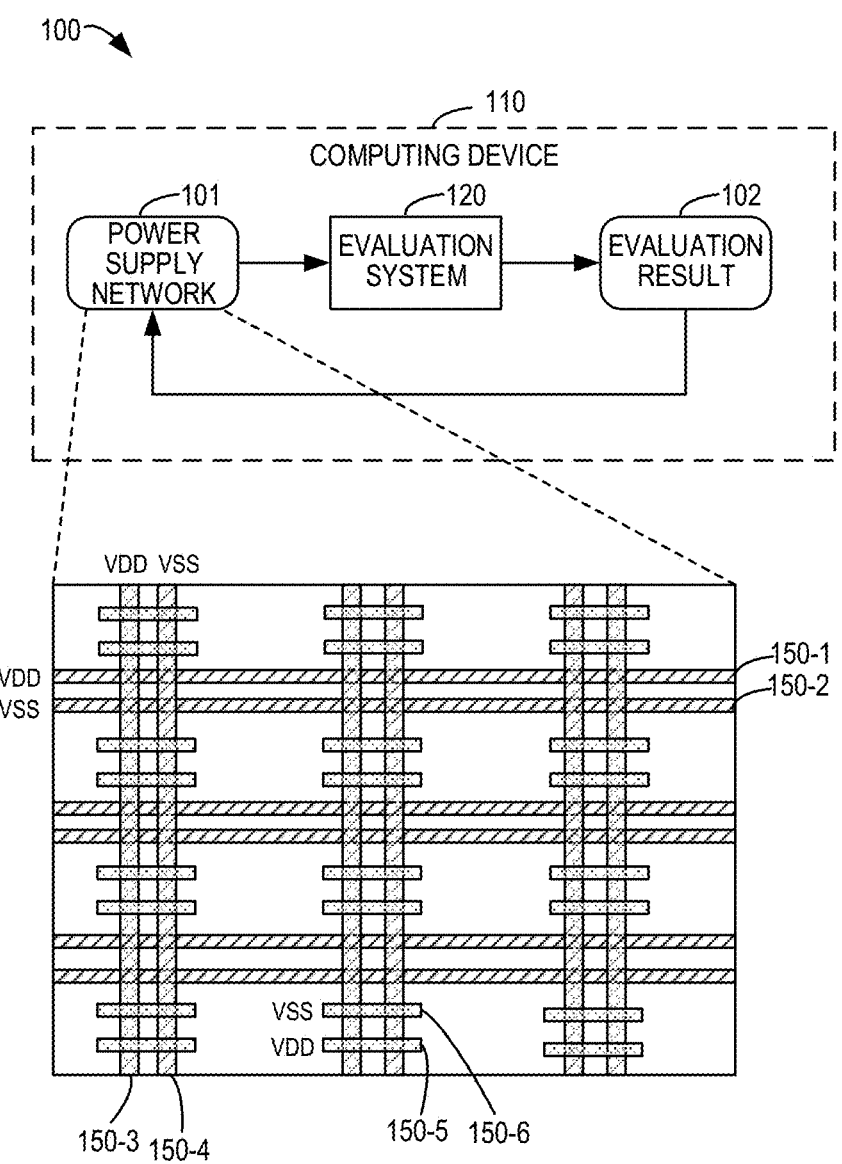
FIG. 1 shows a schematic diagram of an example environment in which embodiments of the present disclosure can be implemented.

Embodiments of the present disclosure will be described in more detail below with reference to the accompanying drawings. Although some embodiments of the present disclosure are shown in the drawings, it should be understood that the present disclosure may be implemented in various forms and should not be construed as being limited to the embodiments set forth herein. On the contrary, these embodiments are provided for a more thorough and complete understanding of the present disclosure. It should be understood that the accompanying drawings and embodiments of the present disclosure are only for exemplary purposes, and are not intended to limit the scope of protection of the present disclosure.

In the description of the embodiments of the present disclosure, the term "comprise" and similar terms should be understood as an open inclusion, that is, "include but not limited to". The term "based on" should be understood as "at least partially based on". The term "an embodiment" or "the embodiment" should be understood as "at least one embodiment". The term "some embodiments" should be understood as "at least some embodiments". Other explicit and implicit definitions may also be included below. The terms "first", "second", etc. may refer to different or the same objects. Other explicit and implicit definitions may also be included below.

As used herein, the term "power supply solution" may include a power supply network designed for a chip. The power supply network represents the position and pattern of a power supply line for power transmission in the chip. The term "power supply line" refers to an electronic representation of a conducting medium (such as a metal line) for power transmission in the chip in a chip design tool. As used herein, the terms "power supply solution" and "power supply network" are used interchangeably.

As used herein, the term "exceed the loss range" refers to not being within the loss range, including being higher than the upper limit of the loss range or lower than the lower limit of the loss range. In the embodiments of the present disclosure, the loss range may be predetermined or may depend on the power supply voltage.

Example Environment

FIG. 1 shows a schematic diagram of an example environment 100 in which embodiments of the present disclosure can be implemented. In the environment 100, a computing device 110 obtains a power supply network 101 designed for a chip. The power supply network 101 comprises a plurality of power supply lines for power transmission. The power supply network 101 also indicates the position and the pattern of each of the power supply lines in the chip.

These power supply lines may be located at different layers of the chip or penetrate from one layer to another. These power supply lines may be different types of power supply lines, for example, high-voltage power supply lines and low-voltage power supply lines. The voltage provided by the high-voltage power supply line may be represented by a symbol VDD, for example, and the voltage provided by the low-voltage power supply line may be represented by a symbol VSS, for example. Generally, high-voltage power supply lines and low-voltage power supply lines occur in pairs.

The position of the power supply line in the chip may include but is not limited to the layer of the power supply line in the chip, the extension range at this layer, the relative position with a further power supply line, and the like. The style of the power supply line may include but is not limited to the shape and size of the power supply line, and the like. In addition, although expressed as a "line", the power supply line may have a width and may have any suitable shape.

FIG. 1 schematically shows a part of the power supply network 101. This part includes a plurality of power supply lines 150-1, 150-2, 150-3, 150-4, 150-5, and 150-6 at different layers of the chip, which are also individually referred to as the power supply line 150 or collectively referred to as the power supply lines 150. The power supply lines 150-1 and 150-2 may be a pair of high-voltage power supply lines and low-voltage power supply lines located at the same layer, the power supply lines 150-3 and 150-4 may be a pair of high-voltage power supply lines and low-voltage power supply lines located at another layer, and the power supply lines 150-5 and 150-6 may be a pair of high-voltage power supply lines and low-voltage power supply lines located at yet another layer. In the example of FIG. 1, these power supply lines 150 have different patterns. For example, the power supply lines 150-5 and 150-6 are short power supply lines, while the power supply lines 150-1, 150-2, 150-3, and 150-4 are slender power supply lines.

An evaluation system 120 is deployed in the computing device 110, which generates an evaluation result 102 for the designed power supply network 101. The evaluation result 102 at least includes voltage losses at different positions of the power supply network 101. The voltage loss may include an absolute voltage loss, such as a voltage drop or an IR drop. Alternatively or additionally, the voltage loss may include a relative voltage loss, such as a ratio of the voltage drop to the power supply voltage.

In some embodiments, in accordance with a determination that the evaluation result 102 indicates that the power supply network 101 passes the verification, the computing device 110 may publish the power supply network 101 for downstream tasks of chip design. In some embodiments, if the evaluation result 102 indicates that the power supply network 101 fails to pass the verification, the computing device 110 may update the power supply network 101 based on the evaluation result 101. If the evaluation result of the updated power supply network 101 indicates that the updated power supply network 101 passes the verification, the computing device 120 may publish the updated power supply network 101 for downstream tasks.

In the environment 100, the computing device 110 may be any type of device with computing capabilities, including a terminal device or a server device. The terminal device may be any type of mobile terminal, fixed terminal or portable terminal, including a mobile phone, a desktop computer, a laptop computer, a notebook computer, a netbook computer, a tablet computer, a media computer, a multimedia tablet, a personal communication system (PCS) device, a personal navigation device, a personal digital assistant (PDA), an audio/video player, a digital camera/video camera, a positioning device, a TV receiver, a radio broadcast receiver, an e-book device, a gaming device, or any combination thereof, including accessories and peripherals of these devices or any combination thereof. The server device may include, for example, a computing system/server, such as a mainframe, an edge computing node, a computing device in a cloud environment, and the like.

It should be understood that the structure and function of the environment 100 are described for illustrative purposes only, without implying any limitation on the scope of the present disclosure. In addition, the number, style and number of layers involved of the power supply lines shown in FIG. 1 are only exemplary and are not intended to limit the scope of the present disclosure. In the embodiments of the present disclosure, the power supply network may have any suitable power supply lines.

In the conventional power supply solution evaluation, a power supply solution is first designed, and then physical implementation is performed, for example, a placement and routing (PR) process is performed. In the PR process, floorplan, standard cell placement, clock tree synthesis (CTS), routing, and the like need to be performed. After the complete PR process is performed, the power supply solution is evaluated. If the power supply solution fails to pass the verification, the power supply solution needs to be adjusted. The adjusted power supply solution needs to be evaluated after the performance of the PR process again. It can be seen that the conventional method performs the physical implementation first and then performs the evaluation.

In this conventional method, the time of one round of iteration is long, for example, it may take more than one week. If multiple rounds of iteration are involved, the design cycle of the chip is seriously affected. In addition, this conventional method relies on a complete set of chip design data, but such data is not easy to obtain in the early stage of chip design.

Embodiments of the present disclosure provide a solution for evaluating a power supply design. According to various embodiments of the present disclosure, a power supply network designed for a chip is determined. The power supply network comprises a plurality of power supply lines for power transmission and indicates a position and a pattern of each of the power supply lines in the chip. An electrical configuration at least associated with a predetermined power consumption of the chip is generated for the power supply network. Voltage losses, such as voltage drops, at different positions of the power supply network with this electrical configuration are predicted. The predicted voltage losses are used to evaluate the designed power supply network.

In the embodiments of the present disclosure, the voltage losses at various positions of the power supply network are predicted by generating an electrical configuration related to the predetermined power consumption. In this way, the designed power supply solution can be evaluated in advance without considering the placement and routing of devices in the chip. That is, the embodiments of the present disclosure support performing evaluation first and then physical implementation. Compared with the conventional method of performing physical implementation first and then evaluation, this method saves the lengthy period of the physical implementation process and realizes the rapid evaluation and verification of the power supply solution. Therefore, the embodiments of the present disclosure are helpful to shorten the cycle of chip design.

Some example embodiments of the present disclosure will be described below with continued reference to the drawings.

Example Evaluation Process

Figure 2:
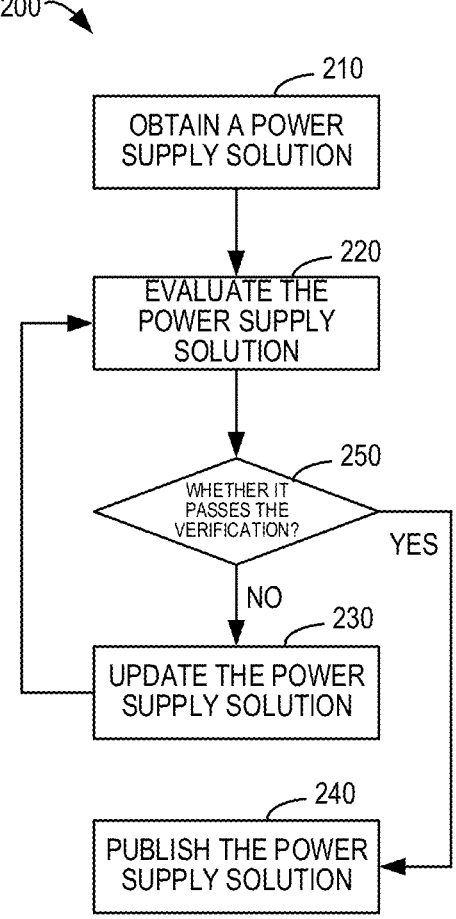
FIG. 2 shows a schematic diagram of an example evaluation process of power supply design evaluation according to some embodiments of the present disclosure.

FIG. 2 shows a schematic diagram of an example evaluation process 200 of power supply design evaluation according to some embodiments of the present disclosure. As shown in FIG. 2, the process 200 may mainly include four phases, namely, power supply solution obtaining 210, power supply solution evaluation 220, power supply solution updating 230 and power supply solution publishing 240.

In the phase of power supply solution obtaining 210, the computing device 110 determines the power supply network 101 designed for the chip. As described with reference to FIG. 1, the power supply network 101 includes a plurality of power supply lines and indicates the positions and the patterns of these power supply lines.

In some embodiments, an electronic design automation (EDA) tool for chip design may be deployed in the computing device 110. A designer of the power supply solution may interact with the computing device 110 through the EDA tool to set the power supply lines layer by layer. Based on the input of the designer, the EDA tool may generate the power supply network 101. In such an embodiment, the computing device 110 generates the power supply network. Alternatively or additionally, in some embodiments, the computing device 110 may receive a design file including the power supply network 101 from the outside. In such an embodiment, the computing device 110 may read the power supply network 101 from the design file.

Since the chip is a complex system, the design of the chip may be carried out according to chip parts (for example, chip modules). Therefore, the design of the power supply solution may also be carried out according to chip parts. In view of this, the power supply network 101 may also have a size to indicate the area of the chip part (for example, the chip module) for which it is used.

In the phase of power supply solution evaluation 220, the computing device 110 generates, for the power supply network 101, an electrical configuration at least associated with a predetermined power consumption of the chip. The computing device 110 may set an electrical attribute and an electrical environment of the power supply network 101 in association with the predetermined power consumption. In the embodiments of the present disclosure, the power supply solution evaluation 220 may occur in the early stage of chip design, that is, it may occur before the placement of devices. In this case, instead of calculating the power consumption based on information such as the timing and capacitance of the device, the predetermined power consumption is used in the embodiments of the present disclosure.

The predetermined power consumption may be the expected power consumption of the chip part for which the power supply network 101 is used. Different chip parts may have different expected power consumption due to performing different functions. Therefore, when the process 200 is used to evaluate the power supply solutions of different chip parts, the used predetermined power consumption may be different.

Figure 3:
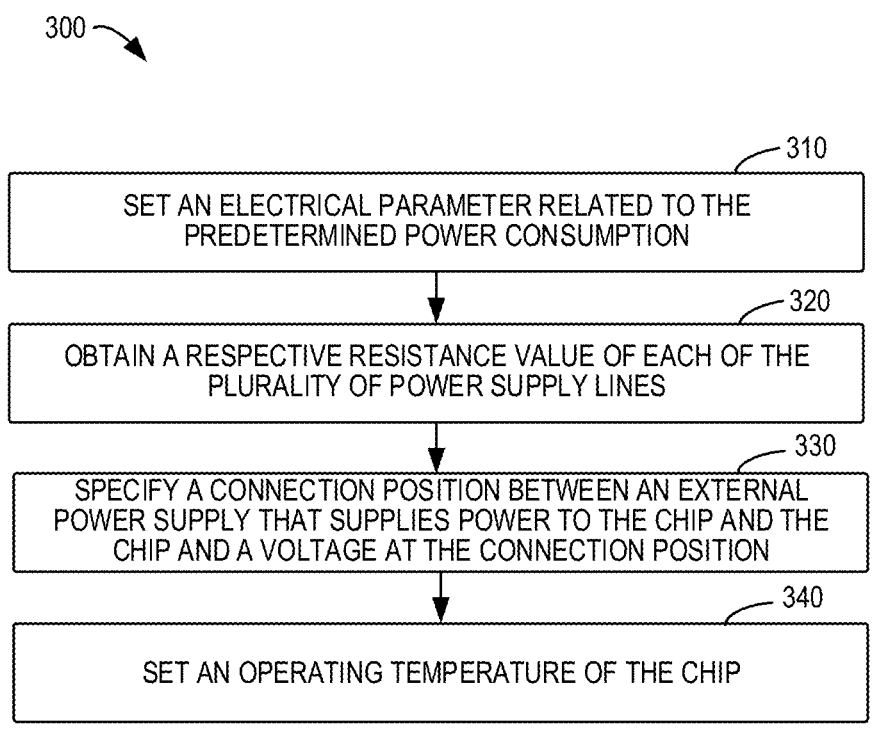
FIG. 3 shows a flowchart of an example process of generating an electrical configuration according to some embodiments of the present disclosure.

FIG. 3 shows a flowchart of an example process 300 of generating an electrical configuration according to some embodiments of the present disclosure. As shown in FIG. 3, at block 310, the computing device 110 sets an electrical parameter related to the predetermined power consumption. The value of the electrical parameter may be included in a configuration file, and the computing device 110 may set the value by reading the configuration file.

In some embodiments, the computing device 110 may set the current flowing through each power supply line to have a current value corresponding to the predetermined power consumption. For example, the computing device 110 may calculate the current values based on the predetermined power consumption and the power supply voltage, and assign the current value to each power supply line. For another example, the current values corresponding to the predetermined power consumption may be included in the configuration file. The computing device 110 may read the current values from the configuration file and set the current values. In such an embodiment, using the current value corresponding to the predetermined power consumption instead of directly using the power consumption value can simplify the subsequent calculation of voltage losses.

At block 320, the computing device 110 may obtain a resistance value of each of the plurality of power supply lines in the power supply network 101. Specifically, the computing device 110 may calculate the resistance value of each power supply line according to the resistance per unit line width and per unit line length (that is, the resistivity) and the connection relationship between the power supply lines. Information about the resistivity of the power supply lines may be included in the configuration file. The computing device 110 may calculate the resistance value of each power supply line by reading the configuration file.

At block 330, the computing device 110 may specify a connection position between an external power supply that supplies power to the chip and the chip and a voltage at the connection position. The connection position may also be referred to as a power supply point. The computing device 110 may specify two types of power supply points, namely high-voltage power supply points and low-voltage power supply points. The high-voltage power supply point may be regarded as a position where current flows into the chip from the external power supply, while the low-voltage power supply point may be regarded as a position where current flows out of the chip. As an example, the high-voltage power supply point may include a power supply point providing VDD, and its voltage may be the power supply voltage; the low-voltage power supply point may include a power supply point providing VSS, and its voltage may be a ground voltage, for example, zero.

The power supply point may be located at the top layer of the chip. The power supply point may be specified using the coordinate of the power supply point in the top layer. In addition, the specification of the power supply point may need to meet the requirements of the chip design regarding the density and spacing of the power supply points, etc. The embodiments of the present disclosure are not limited in this regard.

At block 340, the computing device 110 may set an operating temperature of the chip. The operating temperature of the chip may be related to the expected use scenario of the chip, etc.

It should be understood that the process 300 of generating the electrical configuration shown in FIG. 3 is only exemplary and is not intended to limit the scope of the present disclosure. The execution order of the blocks in the process 300 is not limited. In addition, the electrical parameters or environmental parameters set in the process 300 are only examples, and the computing device 110 may set fewer or more parameters. For example, the computing device 110 may set an evaluation accuracy, enabling or disabling of full-link resistance analysis, a voltage change threshold for the power supply point, and the like.

With continued reference to FIG. 2. In the phase of power supply solution evaluation 220, after generating the electrical configuration, the computing device 110 may predict the voltage losses at different positions of the power supply network 101 with this electrical configuration. The voltage losses at different positions may include continuous voltage losses along the power supply line, or voltage losses at a plurality of sampling positions along the power supply line. The voltage loss may include an absolute value of the voltage drop or a ratio of the voltage drop to the power supply voltage.

In some embodiments, the computing device 110 may present the predicted voltage losses in association with the power supply network 101 based on magnitudes of the predicted voltage losses. In one example, the computing device 110 may output the coordinate of a position where the voltage loss is not within the loss range and the value of the predicted voltage loss at this position. In another example, the computing device 110 may display the power supply network 101 on a display device, and the colors of the displayed power supply network 101 at different positions are related to the predicted voltage losses at the corresponding positions. The larger the predicted voltage loss, the more eye-catching the color. In the case of two-dimensional display, the voltage losses in each layer may be displayed layer by layer. In the case of three-dimensional display, the voltage losses in different layers may be displayed together.

The power supply solution evaluation 220 described above may be implemented using a power analysis engine in the EDA tool. For example, the computing device 110 may call the power analysis engine to generate the electrical configuration and predict the voltage losses. However, this is only exemplary, and the embodiments of the present disclosure are not limited in terms of the implementation means of the power supply solution evaluation 220.

With continued process 200. At block 250, it is determined whether the power supply network 101 passes the verification based on a loss range. The loss range may include an upper limit. If the predicted voltage loss at a position is higher than the upper limit, it means that the power supply design at this position is weak. Such a position may also be referred to as a weak point. Such weak points should be eliminated as many as possible.

Additionally, in some embodiments, the loss range may include a lower limit. If the predicted voltage loss at a position is lower than the lower limit, it means that the voltage design at this position is strong. Such a position may also be referred to as a strong point.

If it is determined that the power supply network 101 passes the verification, that is, if the predicted voltage losses at different positions are all within the loss range, the process 200 proceeds to power supply solution publishing 240. In the phase of power supply solution publishing 240, the computing device 110 may generate a file indicating the power supply network 101 to use the power supply network 101 for a target part of the chip. The target part has a power density corresponding to the area of the power supply network 101 and the predetermined power consumption. For example, a current density may be determined based on the area of the power supply network 101 and the current set in the power supply solution evaluation 220. The target part may be a chip part (for example, a chip module) in the chip where a difference between an expected current density and the current density is within a predetermined range.

The generated file may be published to the downstream tasks of the chip design. For example, the generated file may be used in the subsequent PR process.

If it is determined at block 250 that the power supply network 101 does not pass the verification, that is, if there is one or more positions (also referred to as the first position(s)) where the predicted voltage loss exceeds the loss range, the process 200 proceeds to power supply solution updating 230. In the phase of power supply solution updating 230, the computing device 110 updates the power supply network 101 by updating the power supply line(s) at the first position(s). Updating the power supply line(s) may include but is not limited to adding a new power supply line, extending or shortening an existing power supply line, changing the spacing between adjacent power supply lines, and the like.

In some embodiments, the computing device 110 may update the power supply network 101 based on the interaction with the designer of the power supply solution. Specifically, the computing device 110 may present the predicted voltage losses in association with the power supply network 101 based on the magnitudes of the predicted voltage losses. The presentation manner is as described above.

While the predicted voltage losses are presented, the computing device 110 may detect an instruction to change the power supply line. The instruction may be given by the designer through an interactive component of the computing device 110 (for example, a touch screen, a keyboard, a mouse, etc.). Further, in some embodiments, the computing device 110 may also present the power supply line at the first position in an enlarged manner in response to a selection from the designer. While the power supply line at the first position is presented in the enlarged manner, the computing device 110 may detect an instruction to change the power supply line from the designer. The computing device 110 may then change the power supply line at the first position based on the detected instruction, thereby updating the power supply network 101. For example, when the predicted voltage loss at the first position is higher than the upper limit of the loss range, the instruction may be an instruction to add a new power supply line at the first position or extend an existing power supply line. In this way, the density of the power supply lines near the weak point is increased, which helps to eliminate the weak point and improve the reliability of the power supply solution. For another example, when the predicted voltage loss at the first position is lower than the lower limit of the loss range, the instruction may be an instruction to remove a part of the power supply lines at the first positions or shorten the power supply line at the first position, etc. In this way, the density of the power supply lines near the strong point is reduced. While ensuring the reliability of the power supply, some space may be appropriately released for the signal lines.

Figure 4A:
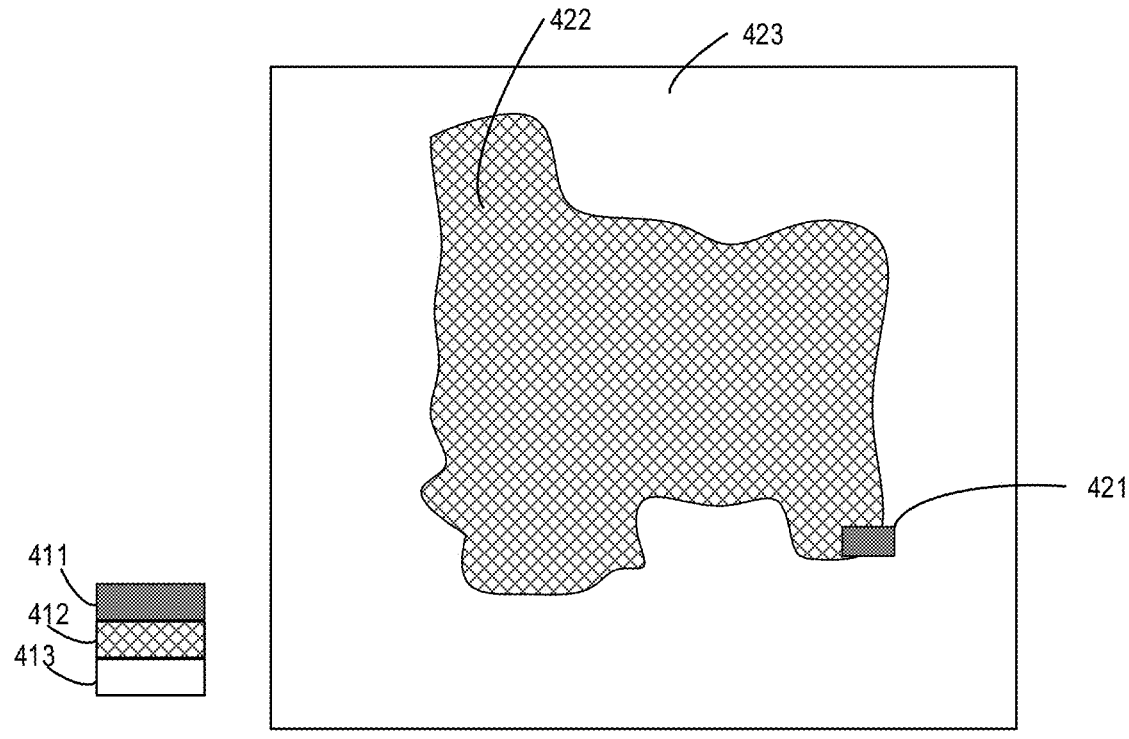
FIG. 4A shows a schematic diagram of an example presentation of voltage losses according to some embodiments of the present disclosure.
Figure 4B:
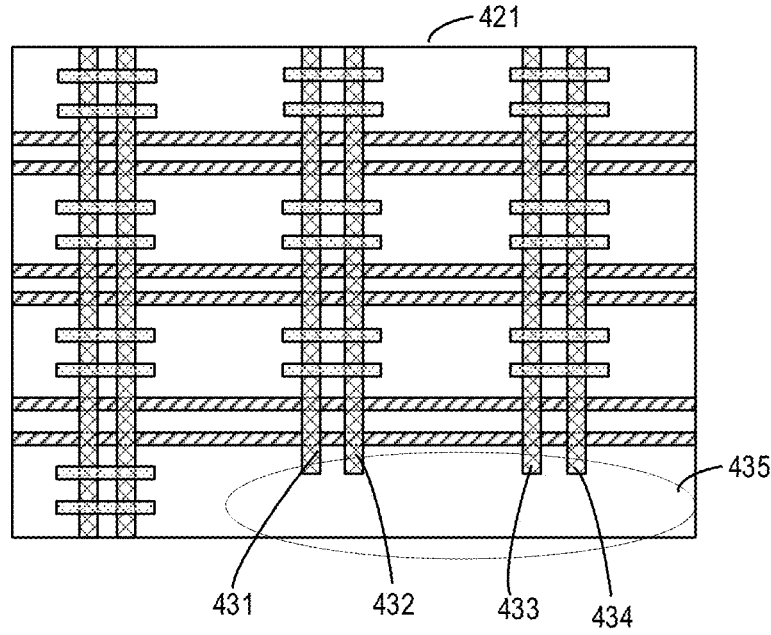
FIG. 4B shows a schematic diagram of an example of a power supply line according to some embodiments of the present disclosure.
Figure 4C:
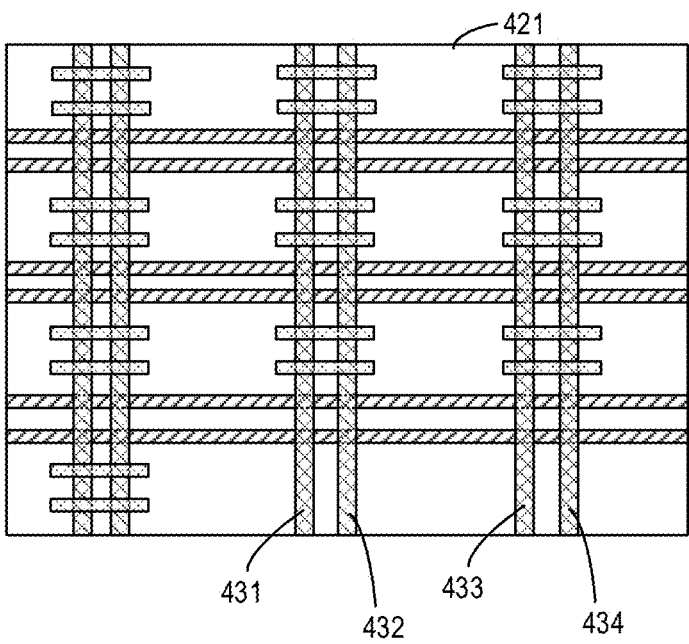
FIG. 4C shows a schematic diagram of an example of changing a power supply line according to some embodiments of the present disclosure.

An example is described below with reference to FIGS. 4A to 4C. FIG. 4A shows a schematic diagram of an example presentation of voltage losses according to some embodiments of the present disclosure. In the example of FIG. 4A, the legend 412 and 413 indicate that the predicted voltage loss is within the loss range, while the legend 411 indicates that the predicted voltage loss exceeds the loss range. Correspondingly, the predicted voltage losses at the positions in the regions 423 and 422 are within the loss range. The predicted voltage loss at the position 421 exceeds the loss range, for example, is higher than the upper limit of the loss range.

It should be understood that the presentation manner of the predicted voltage losses shown in FIG. 4A is only exemplary and is not intended to limit the scope of the present disclosure. In the embodiments of the present disclosure, the predicted voltage losses may be presented in a more refined manner. For example, the displayed color may be associated with the magnitude of the predicted voltage loss.

While the predicted voltage losses are presented, the computing device 110 detects the selection of the position 421. For example, the designer of the power supply solution clicks on the position 421 on the display component or circles the position 421 with a frame. In response to detecting the selection of the position 421, the computing device 110 may present the power supply lines at the position 421 in an enlarged manner, as shown in FIG. 4B. In the example of FIG. 4B, there is a lack of power supply lines at the position 421. Specifically, the power supply lines 431, 432, 433, and 434 do not extend into the area 435.

While the power supply lines at the position 421 are presented in the enlarged manner, the computing device 110 detects an instruction to change the power supply line. Based on the detected instruction, the computing device 110 may change the power supply line at the position 421 to update the power supply network 101. In the example of FIG. 4C, based on the detected instruction, the computing device 110 extends the power supply lines 431, 432, 433, and 434, thereby increasing the density of the power supply lines at the position 421.

With continued reference to FIG. 2. Alternatively, in some embodiments, the computing device 110 may update the power supply network 101 autonomously. Specifically, if the computing device 110 determines that the predicted voltage loss at the first position (also referred to as the first predicted voltage losses) is higher than the upper limit of the loss range, the computing device 110 may increase the density of the power supply lines at the first position to update the power supply network 101. Increasing the density of the power supply lines may include but is not limited to adding a new power supply line, extending an existing power supply line, and reducing the spacing between adjacent power supply lines. In this way, weak points can be eliminated and the reliability of the power supply solution can be improved.

If the computing device 110 determines that the predicted voltage loss at the first position is lower than the lower limit of the loss range, the computing device 110 may reduce the density of the power supply lines at the first position to update the power supply network 101. Reducing the density of the power supply lines may include but is not limited to removing an existing power supply line, shortening an existing power supply line, and increasing the spacing between adjacent power supply lines. In this way, while ensuring the reliability of the power supply, some space may be appropriately released for the signal lines. This is beneficial to achieve a balance between the power supply lines and the signal lines.

In this case, the process 200 may return to the power supply solution evaluation 220 to evaluate the updated power supply network. If the updated power supply network passes the verification, the computing device 110 may generate a file indicating the updated power supply network for publishing it to the downstream tasks. If the updated power supply network does not pass the verification, the computing device 110 may perform the power supply solution updating 230 again to iteratively update the power supply network until it passes the verification.

In the embodiments of the present disclosure, the robustness of the power supply network can be evaluated in the early stage of design without the need to implement the physical process (such as the PR process). The power supply solution may be adjusted accordingly based on the robustness. This promotes the shortening of the power supply design cycle, which is beneficial to shorten the design cycle of the chip.

In addition, the process 200 may be performed for different predetermined power consumption. Different power supply solutions may be provided for different power consumption for use in chip modules with different power densities. For example, different power consumption of chip modules can be fitted by setting different current values, such that differentiated power supply solution design and verification can be performed.

Example Process

Figure 5:
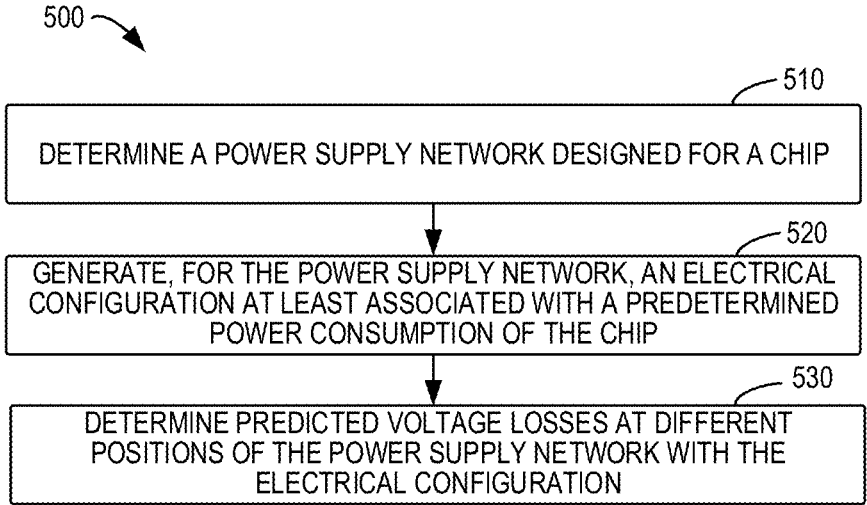
FIG. 5 shows a flowchart of a process of evaluating a power supply design according to some embodiments of the present disclosure.

FIG. 5 shows a flowchart of a process 500 of evaluating a power supply design according to some embodiments of the present disclosure. The process 500 may be implemented at the computing device 110. The process 500 is described below with reference to FIG. 1.

At block 510, the computing device 110 determines a power supply network 101 designed for a chip. The power supply network 101 includes a plurality of power supply lines for power transmission and indicates a position and a pattern of each of the plurality of power supply lines in the chip.

At block 520, the computing device 110 generates, for the power supply network 101, an electrical configuration at least associated with a predetermined power consumption of the chip.

In some embodiments, to generate the electrical configuration, the computing device 110 may set the current flowing through the plurality of power supply lines to have a current value corresponding to the predetermined power consumption.

In some embodiments, the computing device 110 may obtain the resistance value of each of the plurality of power supply lines. Alternatively or additionally, the computing device 110 may set the connection position between an external power supply that supplies power to the chip and the chip and the voltage at the connection position. Alternatively or additionally, the computing device 110 may set the operating temperature of the chip.

At block 530, the computing device 110 determines predicted voltage losses at different positions of the power supply network 101 with the electrical configuration. In some embodiments, if it is determined that the predicted voltage losses at different positions are within the loss range, the computing device 110 may generate a file indicating the power supply network 101 to use the power supply network 101 for a target part of the chip. The target part has a power density corresponding to the area of the power supply network 101 and the predetermined power consumption.

In some embodiments, the computing device 110 may update the power supply network 101 by changing the power supply line(s) at the first position(s) in the different positions. The first predicted voltage loss at the first position(s) exceeds the loss range.

In some embodiments, the computing device 110 may determine updated predicted voltage losses at different positions of the updated power supply network 101. In accordance with a determination that the updated predicted voltage losses are within the loss range, the computing device 110 may generate a file indicating the updated power supply network 101 to use the updated power supply network 101 for the target part of the chip.

The target part has a power density corresponding to the area of the updated power supply network 101 and the predetermined power consumption.

In some embodiments, to update the power supply network 101, the computing device 110 may present the predicted voltage losses at the different positions in association with the power supply network 101 based on the magnitudes of the predicted voltage losses at the different positions. While the predicted voltage losses at the different positions are presented, the computing device 110 may detect an instruction to change the power supply line. The computing device 110 may change the power supply line at the first position based on the detected instruction to update the power supply network 101.

In some embodiments, in response to detecting the selection of the first position while the predicted voltage losses at the different positions are presented, the computing device 110 may present the power supply line at the first position in an enlarged manner. While the power supply line at the first position is presented in an enlarged manner, the computing device 110 may detect an instruction to change the power supply line.

In some embodiments, in accordance with a determination that the first predicted voltage loss is higher than the upper limit of the loss range, the computing device 110 may update the power supply network 101 by increasing the density of the power supply lines at the first position. in accordance with a determination that the first predicted voltage loss is lower than the lower limit of the loss range, the computing device 110 may update the power supply network 101 by reducing the density of the power supply lines at the first position.

Example Apparatus and Device

Figure 6:
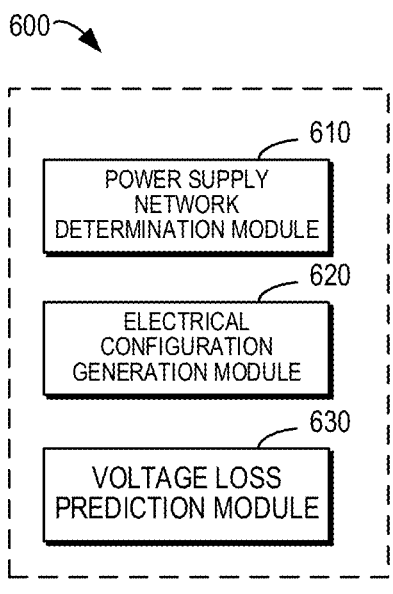
FIG. 6 shows a block diagram of an apparatus for evaluating a power supply design according to some embodiments of the present disclosure.

FIG. 6 shows a schematic block diagram of a structure of an apparatus 600 for evaluating a power supply design according to some embodiments of the present disclosure. The apparatus 600 may be implemented as or included in the computing device 110. Each module/component in the apparatus 600 may be implemented by hardware, software, firmware, or any combination thereof.

As shown in the figure, the apparatus 600 includes a power supply network determination module 610 configured to determine a power supply network designed for a chip, the power supply network comprising a plurality of power supply lines for power transmission and indicating a position and a pattern of each of the plurality of power supply lines in the chip. The apparatus 600 further includes an electrical configuration generation module 620 configured to generate, for the power supply network, an electrical configuration at least associated with a predetermined power consumption of the chip. The apparatus 600 further includes a voltage loss prediction module 630 configured to determine predicted voltage losses at different positions of the power supply network with the electrical configuration.

In some embodiments, the apparatus 600 further includes: a power supply network updating module configured to update the power supply network by changing the power supply line(s) at the first position(s) in the different positions, wherein the first predicted voltage loss at the first position(s) exceeds the loss range.

In some embodiments, the voltage loss prediction module is further configured to determine updated predicted voltage losses at different positions of the updated power supply network. The apparatus 600 further includes a power supply network publishing module configured to generate a file indicating the updated power supply network to use the updated power supply network for a target part of the chip in accordance with a determination that the updated predicted voltage losses are within the loss range, the target part having a power density corresponding to the area of the updated power supply network and the predetermined power consumption.

In some embodiments, the power supply network updating module includes: a voltage loss presentation module configured to present the predicted voltage losses at the different positions in association with the power supply network based on the magnitudes of the predicted voltage losses at the different positions; an instruction detection module configured to detect an instruction to change the power supply line while the predicted voltage losses at the different positions are presented; and a power supply line changing module configured to change the power supply line at the first position based on the detected instruction to update the power supply network.

In some embodiments, the instruction detection module is further configured to: in response to detecting the selection of the first position while the predicted voltage losses at the different positions are presented, present the power supply line at the first position in an enlarged manner; and while the power supply line at the first position is presented in an enlarged manner, detect an instruction to change the power supply line.

In some embodiments, the power supply network updating module comprises one of the following: a density increasing module configured to update the power supply network by increasing the density of the power supply lines at the first position in accordance with a determination that the first predicted voltage loss is higher than the upper limit of the loss range; a density reducing module configured to update the power supply network by reducing the density of the power supply lines at the first position in accordance with a determination that the first predicted voltage loss is lower than the lower limit of the loss range.

In some embodiments, the electrical configuration generation module includes: a current setting module configured to set the current flowing through the plurality of power supply lines to have a current value corresponding to the predetermined power consumption.

In some embodiments, the electrical configuration generation module further comprises at least one of the following: a resistance obtaining module configured to obtain the resistance value of each of the plurality of power supply lines; a power supply point specifying module configured to set the connection position between an external power supply that supplies power to the chip and the chip and the voltage at the connection position; and a temperature setting module configured to set the operating temperature of the chip.

In some embodiments, the apparatus 600 further includes: a power supply network publishing module configured to generate a file indicating the power supply network to use the power supply network for a target part of the chip if it is determined that the predicted voltage losses at different positions are within the loss range, the target part having a power density corresponding to the area of the power supply network and the predetermined power consumption.

Figure 7:
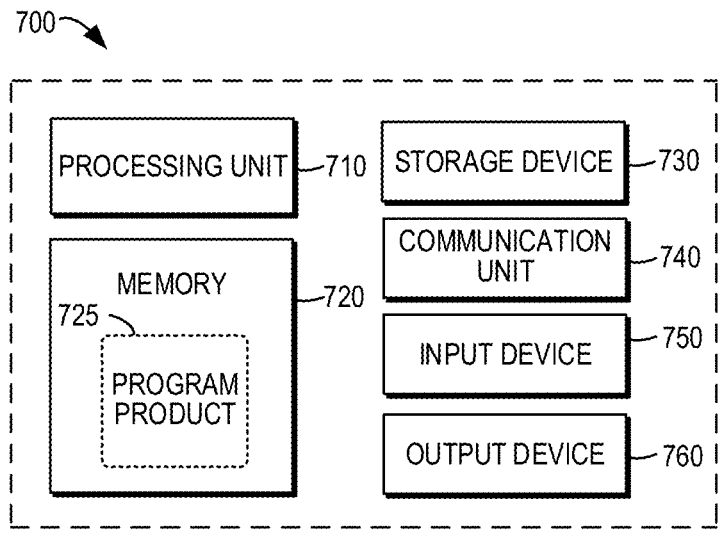
FIG. 7 shows a block diagram of a device in which multiple embodiments of the present disclosure can be implemented.

FIG. 7 shows a block diagram of a computing device 700 in which one or more embodiments of the present disclosure may be implemented. It should be understood that the computing device 700 shown in FIG. 7 is merely exemplary and should not constitute any limitation on the function and scope of the embodiments described herein. The computing device 700 shown in FIG. 7 may be used to implement the computing device 110 of FIG. 1.

As shown in FIG. 7, the computing device 700 is in the form of a general-purpose computing device. Components of the computing device 700 may include, but are not limited to, one or more processors or processing units 710, a memory 720, a storage device 730, one or more communication units 740, one or more input devices 750, and one or more output devices 760. The processing unit 710 may be a physical or virtual processor and can execute various processes according to programs stored in the memory 720. In a multi-processor system, multiple processing units execute computer-executable instructions in parallel to improve the parallel processing capability of the computing device 700.

The computing device 700 generally includes a plurality of computer storage media. Such media may be any available media accessible by the computing device 700, including but not limited to volatile and non-volatile media, detachable and non-detachable media. The memory 720 may be a volatile memory (for example, a register, cache, random access memory (RAM)), a non-volatile memory (for example, a read-only memory (ROM), an electrically erasable programmable read-only memory (EEPROM), flash memory), or some combination thereof. The storage device 730 may be a detachable or non-detachable medium, and may include a machine-readable medium, such as a flash drive, a disk, or any other medium, which may be capable of being used to store information and/or data (for example, training data for training) and may be accessed in the computing device 700.

The computing device 700 may further include additional detachable/non-detachable, volatile/non-volatile storage media. Although not shown in FIG. 7, a disk drive for reading from or writing to a detachable, non-volatile disk (for example, a "floppy disk") and an optical disk drive for reading from or writing to a detachable, non-volatile optical disk may be provided. In these cases, each drive may be connected to a bus (not shown) through one or more data medium interfaces. The memory 720 may include a computer program product 725, which has one or more program modules configured to perform various methods or actions of various embodiments of the present disclosure.

The communication unit 740 communicates with other computing devices through a communication medium. Additionally, the functions of the components of the computing device 700 may be implemented by a single computing cluster or a plurality of computing machines that can communicate through communication connections. Therefore, the computing device 700 may operate in a networked environment using logical connections with one or more other servers, network personal computers (PCs), or another network node.

The input device 750 may be one or more input devices, such as a mouse, a keyboard, a tracking ball, and the like. The output device 760 may be one or more output devices, such as a display, a speaker, a printer, and the like. The computing device 700 may also communicate with one or more external devices (not shown) through the communication unit 740 as required, such as a storage device, a display device, and the like, communicate with one or more devices that enable a user to interact with the computing device 700, or communicate with any device (for example, a network card, a modem, and the like) that enables the computing device 700 to communicate with one or more other computing devices. Such communication may be performed via an input/output (I/O) interface (not shown).

According to an example implementation of the present disclosure, there is provided a computer-readable storage medium having computer-executable instructions stored thereon, wherein the computer-executable instructions, when executed by a processor, implement the method described above. According to an example implementation of the present disclosure, there is further provided a computer program product which is tangibly stored on a non-transitory computer-readable medium and includes computer-executable instructions, and the computer-executable instructions, when executed by a processor, implement the method described above.

Various aspects of the present disclosure are described herein with reference to the flowcharts and/or block diagrams of the method, apparatus, device, and computer program product implemented according to the present disclosure. It should be understood that each block of the flowchart and/or block diagram and the combination of the blocks in the flowchart and/or block diagram may be implemented by computer-readable program instructions.

These computer-readable program instructions may be provided to a processing unit of a general-purpose computer, a special-purpose computer, or other programmable data processing apparatus to produce a machine, such that these instructions, when executed by a computer or other programmable data processing apparatus via the processing unit, generate a device for implementing the functions/actions specified in one or more blocks in the flowchart and/or block diagram. These computer-readable program instructions may also be stored in a computer-readable storage medium. These instructions enable a computer, a programmable data processing apparatus, and/or other devices to operate in a specific manner. Thus, the computer-readable medium storing the instructions includes an article of manufacture which includes instructions for implementing various aspects of the functions/actions specified in one or more blocks in the flowchart and/or block diagram.

The computer-readable program instructions may be loaded onto a computer, other programmable data processing apparatus, or other device, such that a series of operation steps are performed on the computer, other programmable data processing apparatus, or other device to produce a computer-implemented process, such that the instructions executed on the computer, other programmable data processing apparatus, or other device implement the functions/actions specified in one or more blocks in the flowchart and/or block diagram.

The flowcharts and block diagrams in the accompanying drawings illustrate the possibly implemented architecture, functions, and operations of the system, method, and computer program product according to a plurality of implementations of the present disclosure. In this regard, each block in the flowchart or block diagram may represent a part of a module, program segment, or instruction, and the part of the module, program segment, or instruction contains one or more executable instructions for implementing the specified logical functions. In some alternative implementations, the functions marked in the blocks may also occur in an order different from that marked in the accompanying drawings. For example, two consecutive blocks may actually be executed substantially in parallel, or they may sometimes be executed in the reverse order, depending on the functions involved. It should also be noted that each block in the block diagram and/or flowchart, and the combination of the blocks in the block diagram and/or flowchart may be implemented by a dedicated hardware-based system that executes specified functions or actions, or may be implemented by a combination of dedicated hardware and computer instructions.

The various implementations of the present disclosure have been described above. The foregoing descriptions are exemplary, not exhaustive, and are not limited to the disclosed implementations. Many modifications and changes are obvious to those of ordinary skill in the art without departing from the scope and spirit of the described implementations. The selection of terms used herein is intended to best explain the principles, practical applications, or improvements of the technology in the market of the implementations, or to enable other ordinary skilled persons in the art to understand the implementations disclosed herein.

We claim:

1. A method of improving a configuration of a power supply network using an automation tool, comprising:
   determining a power supply network designed for a chip, the power supply network comprising a plurality of power supply lines for power transmission and indicating a position and a pattern of each of the plurality of power supply lines in the chip;
   setting, by the automation tool, a current flow through a virtual representation of the plurality of power supply lines;
   predicting voltage losses at different positions of the power supply network based on the current flow;
   determining at least one region of the power supply network based on the predicted voltage losses and a predetermined loss range;
   displaying, on an interface of the automation tool, the at least one region in a virtual representation of the power supply network, wherein the at least one region is visually differentiated from other regions in the virtual representation of the power supply network; and
   generating an improved configuration of the power supply network based on user input in the at least one region via the interface of the automation tool.

2. The method of claim 1, wherein the generating an improved configuration of the power supply network comprises updating the power supply network by changing at least one power supply line at a first position in the at least one region, wherein a first predicted voltage loss at the first position exceeds the predetermined loss range.

3. The method of claim 2, further comprising:
   determining updated predicted voltage losses at different positions of the updated power supply network; and
   in accordance with a determination that the updated predicted voltage losses are within the predetermined loss range, generating a file indicating the updated power supply network to use the updated power supply network for a target part of the chip, the target part having a power density corresponding to an area of the updated power supply network and a predetermined power consumption of the chip.

4. The method of claim 2, wherein updating the power supply network comprises:
   presenting the predicted voltage losses at the different positions in association with the power supply network based on magnitudes of the predicted voltage losses at the different positions;
   detecting an instruction to change the power supply line with the predicted voltage losses at the different positions being presented; and
   changing the power supply line at the first position based on the detected instruction, to update the power supply network.

5. The method of claim 4, wherein detecting the instruction to change the power supply line comprises:
   in response to detecting the user input in the at least one region via the interface of the automation tool, presenting the power supply line at the first position in an enlarged manner; and
   detecting the instruction to change the power supply line with the power supply line at the first position being presented in the enlarged manner.

6. The method of claim 2, wherein updating the power supply network comprises one of the following:
   in accordance with a determination that the first predicted voltage loss is higher than an upper limit of the predetermined loss range, updating the power supply network by increasing a density of the power supply lines at the first position;
   in accordance with a determination that the first predicted voltage loss is lower than a lower limit of the predetermined loss range, updating the power supply network by reducing the density of the power supply lines at the first position.

7. The method of claim 1, wherein setting the current flow through the virtual representation of the plurality of power supply lines comprises:
   setting a current flowing through the virtual representation of the plurality of power supply lines to have a current value corresponding to a predetermined power consumption of the chip.

8. The method of claim 2, wherein setting the current flow through the virtual representation of the plurality of power supply lines comprises at least one of the following:

obtaining a respective resistance value of each of the plurality of power supply lines;

setting a connection position between an external power supply that supplies power to the chip and the chip and a voltage at the connection position; and setting an operating temperature of the chip.

9. The method of claim 1, further comprising:

in accordance with a determination that the predicted voltage losses at the different positions are within the predetermined loss range, generating a file indicating the power supply network to use the power supply network for a target part of the chip, the target part having a power density corresponding to an area of the power supply network and the predetermined power consumption.

10. An electronic device, comprising:

at least one processing unit; and at least one memory coupled to the at least one processing unit and storing instructions executable by the at least one processing unit, the instructions, when executed by the at least one processing unit, causing the electronic device to perform operations comprising:

determining a power supply network designed for a chip, the power supply network comprising a plurality of power supply lines for power transmission and indicating a position and a pattern of each of the plurality of power supply lines in the chip;

setting, by the automation tool, a current flow through a virtual representation of the plurality of power supply lines;

predicting voltage losses at different positions of the power supply network based on the current flow;

determining at least one region of the power supply network based on the predicted voltage losses and a predetermined loss range;

displaying, on an interface of the automation tool, the at least one region in a virtual representation of the power supply network, wherein the at least one region is visually differentiated from other regions in the virtual representation of the power supply network; and generating an improved configuration of the power supply network based on user input in the at least one region via the interface of the automation tool.

11. The device of claim 10, wherein the generating an improved configuration of the power supply network comprises updating the power supply network by changing at least one power supply line at a first position in the at least one region, wherein a first predicted voltage loss at the first position exceeds the predetermined loss range.

12. The device of claim 11, wherein the operations further comprise:

determining updated predicted voltage losses at different positions of the updated power supply network; and in accordance with a determination that the updated predicted voltage losses are within the predetermined loss range, generating a file indicating the updated power supply network to use the updated power supply network for a target part of the chip, the target part having a power density corresponding to an area of the updated power supply network and a predetermined power consumption of the chip.

13. The device of claim 11, wherein updating the power supply network comprises:

presenting the predicted voltage losses at the different positions in association with the power supply network based on magnitudes of the predicted voltage losses at the different positions;

detecting an instruction to change the power supply line with the predicted voltage losses at the different positions being presented; and changing the power supply line at the first position based on the detected instruction, to update the power supply network.

14. The device of claim 13, wherein detecting the instruction to change the power supply line comprises:

in response to detecting the user input in the at least one region via the interface of the automation tool, presenting the power supply line at the first position in an enlarged manner; and detecting the instruction to change the power supply line with the power supply line at the first position being presented in the enlarged manner.

15. The device of claim 11, wherein updating the power supply network comprises one of the following:

in accordance with a determination that the first predicted voltage loss is higher than an upper limit of the predetermined loss range, updating the power supply network by increasing a density of the power supply lines at the first position;

in accordance with a determination that the first predicted voltage loss is lower than a lower limit of the predetermined loss range, updating the power supply network by reducing the density of the power supply lines at the first position.

16. The device of claim 10, wherein setting the current flow through the virtual representation of the plurality of power supply lines comprises:

setting a current flowing through the virtual representation of the plurality of power supply lines to have a current value corresponding to a predetermined power consumption of the chip.

17. The device of claim 11, wherein setting the current flow through the virtual representation of the plurality of power supply lines comprises at least one of the following:

obtaining a respective resistance value of each of the plurality of power supply lines;

setting a connection position between an external power supply that supplies power to the chip and the chip and a voltage at the connection position; and setting an operating temperature of the chip.

18. The device of claim 10, wherein the operations further comprise:

in accordance with a determination that the predicted voltage losses at the different positions are within the predetermined loss range, generating a file indicating the power supply network to use the power supply network for a target part of the chip, the target part having a power density corresponding to an area of the power supply network and the predetermined power consumption.

19. A non-transitory computer-readable storage medium having a computer program stored thereon, the computer program executable by a processor to implement a method comprising:

determining a power supply network designed for a chip, the power supply network comprising a plurality of power supply lines for power transmission and indicating a position and a pattern of each of the plurality of power supply lines in the chip;

setting, by the automation tool, a current flow through a virtual representation of the plurality of power supply lines;

predicting voltage losses at different positions of the power supply network based on the current flow;

determining at least one region of the power supply network based on the predicted voltage losses and a predetermined loss range;

displaying, on an interface of the automation tool, the at least one region in a virtual representation of the power 5 supply network, wherein the at least one region is visually differentiated from other regions in the virtual representation of the power supply network; and generating an improved configuration of the power supply network based on user input in the at least one region 10 via the interface of the automation tool.

20. The medium of claim 19, wherein the generating an improved configuration of the power supply network comprises: updating the power supply network by changing at least one power supply line at a first position in the at least 15 one region, wherein a first predicted voltage loss at the first position exceeds the predetermined loss range.

\* \* \* \* \*